United States Patent [19]
Celler et al.

[11] Patent Number: 5,482,802
[45] Date of Patent: Jan. 9, 1996

[54] MATERIAL REMOVAL WITH FOCUSED PARTICLE BEAMS

[75] Inventors: George K. Celler, New Providence; Lloyd R. Harriott, Gillette; Ratnaji R. Kola, Berkeley Heights, all of N.J.

[73] Assignee: AT&T Corp., Murray Hill, N.J.

[21] Appl. No.: 157,590

[22] Filed: Nov. 24, 1993

[51] Int. Cl.$^6$ ........................................ G03F 9/00
[52] U.S. Cl. .............................. 430/5; 430/311; 430/396; 378/34; 378/35; 216/12; 216/63; 216/66
[58] Field of Search ................... 430/5, 311, 396; 156/652, 655, 656; 378/34, 35

[56] References Cited

U.S. PATENT DOCUMENTS

| | | |
|---|---|---|
| 5,051,326 | 9/1991 | Celler et al. .................................. 430/5 |
| 5,079,112 | 1/1992 | Berger et al. .................................. 430/4 |

FOREIGN PATENT DOCUMENTS 63-60331  3/1988  Japan .

OTHER PUBLICATIONS

Sze, S. M., ed., *VLSI Technology,* (McGraw–Hill Book Company, New York), c. 1983.
Thompson, L. F., et al., eds., *Introduction to Microlithography,* (American Chemical Society, Washington, D.C.), c. 1983.
Wagner, A., *Solid State Technology,* May 1983, pp. 97–103.
Dubner, A. D. et al., "In situ Measurement of Ion–Beam–Induced Deposition of Gold," *J. Appl. Phys.,* vol. 65, No. 9, May 1989, pp. 3636–3643.
Nastasi, M. et al., eds., *Beam Solid Interactions: Fundamentals and Applications,* (Pittsburgh, Pa.: Materials Research Society, c. 1993) *Material Research Society Symposium Proceedings,* Nov. 30–Dec. 4, 1992, Boston, Mass., vol. 279, Kola, R. R. et al., "Roughness Effects During Focused Ion Beam Repair of X–Ray Masks With Polycrystalline Tungsten Absorbers," pp. 593–598.
Pellerin, J. G. et al., "Focused Ion Beam Machining of Si, GaAs, and InP," *J. Vac. Sci. Technol. B,* vol. 8, No. 6, Nov./Dec. 1990, pp. 1945–1950.
Crow, G. et al., "The use of vector scanning for producing arbitrary surface contours with a focused ion beam," *J. Vac. Sci. Technol. B,* vol. 6, No. 5, Sep./Oct. 1988, pp. 1605–1607.
Dubner, A. D. et al., "The role of gas adsorption in ion–beam–induced deposition of gold," *J. Appl. Phys.,* vol. 66, No. 2, 15 Jul. 1989, pp. 870–874.
Shedd, G. M., "Focused Ion Beam Induced Deposition of Gold," *Appl. Phys. Lett.,* vol. 49, No. 23, 8 Dec. 1986, pp. 1584–1586.
Gamo, Ke. et al., "Ion Beam Assisted Deposition of Metal Organic Films Using Focused Ion Beams," *Japanese Journal of Applied Physics,* vol. 23, No. 5, May 1984, pp. L293–L295.

(List continued on next page.)

*Primary Examiner*—S. Rosasco
*Attorney, Agent, or Firm*—Margaret A. Burke

[57] ABSTRACT

The present invention provides a process for locally removing at least a portion of a material layer structure in which first and second materials are provided, the second material having a higher etch rate by an activated reaction gas than the first material. The second material is disposed over at least a portion of the first material. A reaction gas flows adjacent a portion of the second material to be removed. The reaction gas is chemically reactive with at least the second material to form volatile reaction products when activated by a focused particle beam, but does not spontaneously react with the second material.

The portion of the second material to be removed is irradiated with a focused particle beam. Exemplary particle beams are focused ion beams and electron beams. The focused particle beam initiates a chemical reaction between the portion of the second material and the reaction gas, forming volatile reaction products which desorb from the substrate and are removed. This technique finds particular application for removal of opaque defects on tungsten absorber x-ray masks.

15 Claims, 2 Drawing Sheets

OTHER PUBLICATIONS

Gamo, K. et al., "Ion Beam Assisted Etching and Deposition," *J. Vac. Sci. Technol. B,* vol. 8, No. 6, Nov./Dec. 1990, pp. 1927–1931.

Harriott, L. R. et al.,"Micromachining of Integrated Optical Structures," *Appl. Phys. Lett.,* vol. 48, No. 25, 23 Jun. 1986, pp. 1704–1706.

Wagner, A., et al., "X–ray Mask Repair With Focused Ion Beams," *J. Vac. Sci. Technol. B,* vol. 8, No. 6, Nov./Dec. 1990, pp. 1557–1564.

Melngailis, J., "Focused Ion Beam Technology and Applications," *J. Vac. Sci. Technol. B,* vol. 5, No. 2, Mar./Apr. 1987, pp. 469–495.

Gamo, K. et al., "Ion Beam Assisted Maskless Etching of GaAs by 50 keV Focused Ion Beam," *Japanese Journal of Appl. Phys.,* vol. 21, No. 12, Dec. 1982, pp. L792–L794.

Yuba, Y. et al., "Ion Beam Etching of InP.I. Ar Ion Beam Etching and Fabrication of Grating for Integrated Optics," *Japanese Journal of Applied Physics,* vol. 22, No. 7, Jul., 1983, pp. 1206–1210.

Yuba, Y. et al., "Ion Beam Etching of InP.II. Reactive Etching with Halogen–Based Source Gases," *Japanese Journal of Applied Physics,* vol. 22, No. 7, Jul., 1983, pp. 1211–1214.

Prewett, P. D. et al., "FIB Repair of Clear and Opaque Defects in X–Ray Masks," *Microelectronic Engineering,* vol. 17, (1992), pp. 249–254.

Atkinson, G. M. et al., "The Effects of Mask Scattering on Photoresist Profiles in Masked Ion Beam Lithography," *Nuclear Instruments and Methods in Physics Research B7/8,* (1985), pp. 872–876.

Gamo, K., et al., "Characteristics of Mass–Separated Fine Focused Ion Beam System and Maskless Fabrication," *Microcircuit Engineering 82,* Grenoble, France, pp. 143–147.

MATERIAL REMOVAL WITH FOCUSED PARTICLE BEAMS

BACKGROUND OF THE INVENTION

1. Field of the Invention

This invention relates to material removal using focused particle beams and, more particularly, to mask modification by using focused ion beams or electron beams.

2. Description of the Related Art

Integrated circuit fabrication generally employs lithographic processes to form circuit elements on the surface of a semiconductor wafer. In many lithography processes, a mask shapes an exposing energy source to form patterns in a resist which is sensitive to that energy source. The exposing energy source can be, for example, ultraviolet light, x-rays, ion beams, or electron beams selected according to the device being formed and the desired resolution.

The design of the mask depends upon the exposing energy source for lithography. In optical lithography, masks can be glass or quartz covered with a material which absorbs light such as chromium, chromium oxide, iron oxide, or silicon. In x-ray lithography, an x-ray absorbing material such as gold or tungsten is patterned on an x-ray transmitting membrane such as silicon, silicon nitride, silicon carbide, aluminum oxide, polyimide, and combinations of these layers. In SCALPEL (SCattering with Angular Limitation Projection Electron Lithography), masks are used to interact with electrons for resist exposure. Detailed information concerning lithography and mask formation is found in S. M. Sze, Ed., *VLSI Technology*, (McGraw-Hill Book Company, New York), c. 1988 and L. F. Thompson, Ed., *Introduction to Microlithography*, (American Chemical Society, Washington, D.C.), c. 1983, the disclosures of which are incorporated by reference. Further information on SCALPEL lithography is found in Berger et al., U.S. Pat. No. 5,079,112, the disclosure of which is incorporated by reference.

For reliable lithography processing, the mask must be essentially free from defects. Defects in the mask pattern generally fall within one of two categories: clear defects and opaque defects. Clear defects occur when a portion of the mask pattern is missing while opaque defects occur when excess material is present.

Defect repair entails deposition of additional material to fill in clear defects and removal of material to eliminate opaque defects. In the past, material has been removed by focused ion beams to directly sputter away the opaque defect. There are several problems with this approach. First, the sputter rate of a polycrystalline material is dependent upon its orientation with respect to the ion beam. Grains with low index planes oriented parallel to the ion beam have significant ion channeling resulting in a low sputter rate. Grains whose planes are misoriented, i.e., whose planes are not perfectly parallel to the ion beam but are impinged by the beam at an angle, have a higher sputter rate. For a polycrystalline sputter target, grains which are misoriented with respect to the ion beam are preferentially sputtered. As a result of this preferential sputtering, a rough residue of unsputtered material remains on the layer or substrate underneath after high sputter rate grains have been removed. This phenomenon is shown in FIG. 1, which depicts tungsten residue following sputtering with a $Ga^+$ focused ion beam. Further sputtering to remove this residue leads to undesirable substrate etching.

The rough residue resulting from preferential sputtering also creates problems at the sidewalls of the region being etched. For thicker layers of material, grain sizes are usually larger due to grain growth during layer buildup. When some grains are preferentially sputtered, the edges of remaining grains create a rough line. For example, in tungsten absorber x-ray masks, tungsten grain sizes for a 3000 Å film are approximately 0.15 micron. Because desired feature resolutions are on the order of 0.25 micron, sidewall roughness of 0.15 micron for tungsten x-ray absorber results in unacceptable image production. Generally, roughness should be no more than approximately 10% of the feature size.

Another problem associated with ion beam sputtering is redeposition of the sputtered material on nearby features. Redeposition is especially a problem for opaque defect removal on x-ray masks due to the large aspect ratio (absorber thickness to feature size) and dense patterns found on x-ray masks. The redeposited material blurs pattern features, e.g., by depositing on sidewalls, resulting in poor image quality.

Thus there is a need in the art for improved etching processes which can locally remove portions of a material layer without the anisotropy and resputtering associated with physical ion beam etching. Such a technique could be used for fine etching and mask modifications, particularly the removal of opaque mask defects.

SUMMARY OF THE INVENTION

The present invention provides a process for locally removing at least a portion of a layer structure in which first and second materials are provided, the second material having a higher etch rate by an activated reaction gas than the first material. The second material is disposed over at least a portion of the first material. A reaction gas flows adjacent a portion of the second material to be removed. The reaction gas is chemically reactive with at least the second material to form volatile reaction products when activated by a focused particle beam, but does not spontaneously etch the second material to any substantial extent.

The portion of the second material to be removed is irradiated with a focused particle beam. Exemplary particle beams are focused ion beams and electron beams. The focused particle beam initiates a chemical reaction between the portion of the second material and the reaction gas, forming volatile reaction products which desorb from the substrate and are removed. This technique finds particular application for removal of opaque defects on tungsten absorber x-ray masks.

DETAILED DESCRIPTION

Turning now to the drawings in detail, the preferred embodiments of the present invention are described with reference to removal of opaque defects from a tungsten absorber x-ray mask. Although embodiments of the invention are discussed in the context of opaque defect removal, it is understood that the processes described herein may be applied to the etching of materials for a variety of purposes including, but not limited to, mask modification and circuit modification such as wiring path and electrode etching.

The process of the present invention employs the principles of etch selectivity between an activated reaction gas and materials to be removed from a substrate. The removal process acts upon a multilayer structure of at least two materials having different etch rates by an activated reaction gas. The reaction gas is activated with a focused particle beam to remove material.

The term "focused particle beam" as used herein, describes beams of particles which have been shaped by an electromagnetic field including, but not limited to, focusing or collimating electromagnetic fields.

Figure 2:
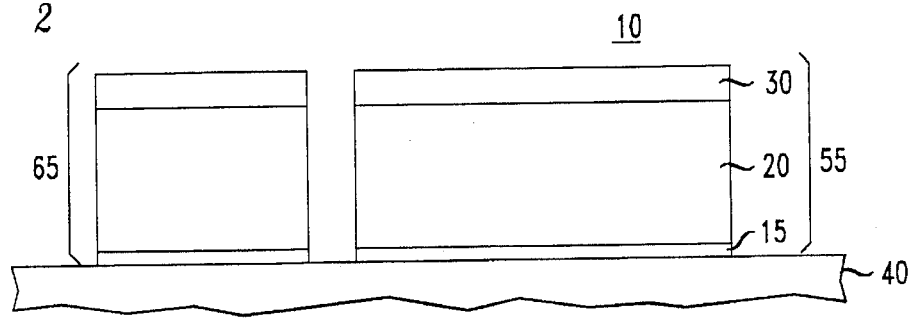
FIG. 2 illustrates a layer structure employed in a tungsten absorber x-ray mask which may be etched using the processes of the present invention.
Figure 3:
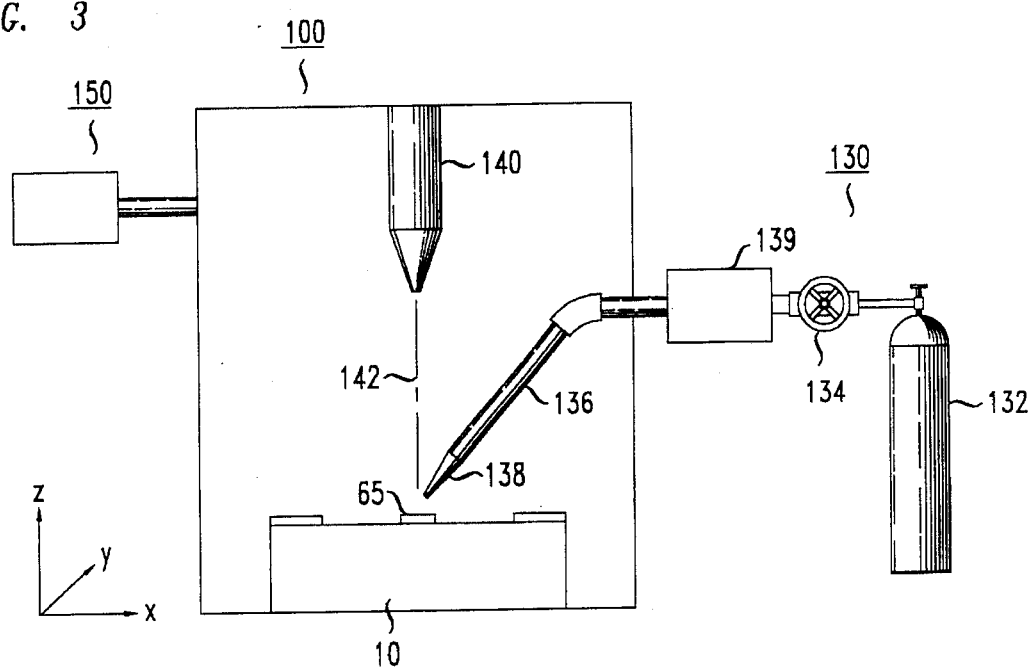
FIG. 3 is a schematic representation of an apparatus for practicing the process of the present invention.

FIG. 2 illustrates a layer structure used in a tungsten absorber x-ray mask. The mask 10 includes a multilayer pattern feature 55 disposed upon a substrate 40. The multilayer pattern 55 includes a first layer 15 of a first material having a low etch rate by an activated reaction gas and a second layer 20 of a second material having a high etch rate by an activated reaction gas in comparison to the first layer. Neither the first nor the second materials are spontaneously etched by the reaction gas, i.e., they are not etched by the reaction gas to a substantial extent in the absence of activation energy. By the phrase "to a substantial extent" it is meant that material removal by the unactivated gas is less than approximately 5 Å per minute. In relative terms, exemplary etch rates of the second material by the activated reaction gas are at least on the order of five times higher than the etch rate of the first material. Generally, the greater the difference between the etch rates of the first and second materials by the activated reaction gas, the greater the selectivity of the process.

For x-ray masks, the layer 15 is, for example, chromium having a thickness in the range of 50–300 Å, especially 100–200 Å. The layer 20 is, for example, a tungsten x-ray absorber layer having a thickness in the range of 2000 Å-1 micron. An exemplary tungsten absorber thickness is 3000 Å. The multilayer structure 55 is disposed upon an x-ray transmitting membrane, advantageously, a membrane having a coefficient of thermal expansion approximating that of tungsten and having good mechanical properties. Silicon, silicon nitride, silicon carbide, and diamond are examples of membrane materials having these characteristics.

The multilayer pattern 55 optionally includes a top layer 30 of a material which has a relatively low etch rate by the reaction gas compared to layer 20. For an x-ray mask, layer 30 is, for example, a chromium layer having a thickness in the range of 50–300 Å. The chromium layers 15 and 30 are used during x-ray mask fabrication because of their lower etch rates than tungsten in the fluorine plasma used during mask fabrication. Because of its lower etch rate, layer 15 acts as an etch stop layer while layer 30 helps achieve vertical sidewalls when forming the initial mask pattern.

Fabrication of multilayer patterns such as multilayer structure 55 for x-ray masks is performed by any known deposition technique including, but not limited to, sputtering, ion beam sputtering, evaporation, laser ablation, and the like. Patterns are formed using known lithography and dry or wet etching procedures. Further details of x-ray mask fabrication are found in Celler et al., U.S. Pat. No. 5,051, 326, the disclosure of which is incorporated by reference herein.

As shown in FIG. 2, mask 10 further includes a structure 65 which includes layers 15, 20, and 30. However, structure 65 is positioned in a region of the mask which is designed to transmit exposing energy. Structure 65 is therefore an opaque defect on mask 10.

After mask 10 is formed, it is inspected to compare the constructed pattern with the model pattern. This may be performed in any conventional manner. Typically, a developed resist image printed on a substrate from the mask is inserted into an apparatus similar to a scanning electron microscope. An example of a commercial defect detection apparatus is SEM-SPEC, available from KLA Instruments. Beams of electrons are bombarded on the substrate surface, the backscattered and/or secondary electrons forming an image of the substrate. This substrate image is compared to the model image to determine the position of any defects such as clear and opaque defects. Thus, only defects which lead to printing errors are detected.

Using such a system, opaque defect 65 is detected. The coordinates of the clear and opaque defects are recorded, the positions corresponding to the same sites on the mask, and the mask is positioned in an apparatus for mask modification. Alternatively, opaque and clear defects can be detected directly on the mask rather than on a printed image formed using the mask. Although not depicted here, the defect detection system can be incorporated into the apparatus for mask modification.

After defects have been detected, mask 10 containing defect 65 is placed in vacuum apparatus 100. The mask is placed on a stage capable of positioning the mask in at least the x and y directions. Apparatus 100 connects to evacuation system 150, generally in the form of one or more vacuum pumps, capable of achieving vacuum at least on the order of $10^{-7}$ Torr. The process of the present invention is generally performed using a background pressure in the range of $10^{-7}$ to $10^{-5}$ Torr. To activate the etching chemical reaction, apparatus 100 includes particle beam generator 140 for generating a particle beam 142. Exemplary particle beam generators 140 include electron beam generators and focused ion beam generators. Further information concerning the design and operation of focused ion beam generators may be found in Wagner, *Solid State Technology*, May 1983, pp. 97–103, the disclosure of which is incorporated herein by reference.

When using focused ion beams, acceleration voltages in the range of 10–100 keV are used. Exemplary acceleration voltages are in the range of 20– 30 keV. The current of the focused ion beam is generally in the range of 10–1000 pA while the current density is in the range of 1–10 A/cm$^2$.

Apparatus 100 includes a gas jet system 130 for inputing a reaction gas adjacent opaque defect 65 on x-ray mask 10. The gas jet system comprises a reservoir of reaction gas 132 releasable by leak valve 134. A capacitance manometer pressure gauge (not shown) maintains the desired pressure and controls the flow through valve 134. After passing through valve 134, the gas is introduced into the vacuum chamber via gas inlet tube 136. To localize the flow of the reaction gas, gas inlet tube 136 terminates in small capillary tube 138 which is placed about 50 microns above the sample in the field of view of the focused particle beam 142. During etching, pressures within the gas jet system generally range from 0.1–10 Torr, with local pressures adjacent the region to be etched being approximately ⅓ of this pressure, i.e., 0.03–3.3 Torr.

Positioning of the gas inlet tube 136 and capillary 138 is performed by manipulator 139. Manipulator 139 can move the inlet tube 136 and the capillary 138 in at least the z direction, and, optionally, in the x, y, and z directions permitting the distance from the substrate to be varied depending upon the needs of the particular process.

The reaction gas which is locally input adjacent opaque defect structure to be removed does not spontaneously chemically react with either the first layer 15 or the second layer 20 to any substantial extent. Additionally, the reaction gas can be selected such that it does not substantially react with the substrate 40. The reaction gas requires the input of activation energy, supplied by particle beam 142 in order to chemically react with layer 20. The reaction gas is selected, in conjunction with the selection of layer 20, for its ability to form volatile reaction products with the material used to form layer 20. In contrast, the reaction gas either does not form volatile reaction products with the material of layer 15 or reacts with the material of layer 15 at a substantially lower rate than it reacts with the material of layer 20.

Through this lower etch rate, layer 15 acts as an etch stop layer. Thus, the material removal process is substantially slowed before etching of the substrate occurs. Upon reaching layer 15, the etching process may continue, proceeding at a slower pace due to the lower etch rate, or a different etching process may be performed. For example, upon reaching layer 15, the flow of reaction gas to the region can be terminated, allowing layer 15 to be removed via a physical sputtering process by the particle beam. Alternatively, a different reaction gas may be input which forms volatile reaction products with layer 15.

Because layer 30 is not substantially etched by the reaction gas, it serves as a mask for gas adsorption by underlying layer 20. Layer 30 is much thinner than layer 20 and, as such, has a much smaller grain size, typically, on the order of the layer thickness. When layer 30 is removed via a predominantly physical process such as sputtering, the residual roughness is much less than for physical sputtering of layer 20. When layer 30 is removed using the reaction gas activated by a focused particle beam according to the invention, the remaining portion of layer 30 with its smoother sidewall defines the region of layer 20 upon which reaction gas will be adsorbed and upon which the focused particle beam will impinge, thus ensuring acceptable sidewall smoothness for sub-micron device fabrication. As an example, when layer 30 is a 200 Å chromium film and layer 20 is a 3000 Å tungsten film, the sidewall roughness of layer 20 following physical removal of a portion of the layer is on the order of 200 Å, i.e., 0.02 micron. This is less than 10% of a 0.25 micron mask feature, within the acceptable range of roughness to feature size.

The reaction gas comprises a halogen or a halogenated gas including, but not limited to, $XeF_2$, $CF_4$, $NF_3$, $CCl_3F$, $CCl_2F_2$, $CClF_3$, $C_2F_6$, $C_3F_8$, $SF_6$, and $WF_6$. Heavier reaction gases are generally better adsorbed by a material layer than lighter reaction gases. Other reaction gases are used depending upon the material of layer 20. When layer 20 is selected to be tungsten, $XeF_2$ is an exemplary reaction gas. Layer 20 at least partially adsorbs the reaction gas in the region adjacent capillary 138.

Following adsorption of the reaction gas, focused particle beam 142 impinges layer 20 at the point where material is to be removed. Depending upon the type of particle beam and the degree of focus, the beam diameter ranges from 0.01 to 0.2 microns. Larger beams may be used when etching large patterns. For removal of defects on x-ray masks, exemplary particle beams are focused ion beams having diameters of about 0.02–0.05 microns. Because the reaction is localized to the region of beam impingement, the process is both horizontally and vertically selective, i.e., it is horizontally selectively due to the highly localized nature of the chemical reaction and is vertically selective due to the different reactivities of the materials of the multilayer structure.

The particle beam 142 is scanned through a series of pixels, i.e., the positions on the substrate occupied by the particle beam. Rastering is an example of a scanning technique used to move the particle beam. The duration of the particle beam at a particular position is the pixel dwell time. Commercially available systems can program a rastern pattern given the defect dimensions and other system parameters.

The etch rate is a function of the reaction gas pressure in the region of the material to be removed, the current density of the particle beam, the pixel dwell time, and the gas refresh time. At equilibrium, an etching rate is achieved in which the ion flux and etchant gas flux are roughly matched and remain constant, regardless of the pixel dwell time. However, the greatest etch rates are achieved during the initial exposure, when the adsorbed gas reacts with the substrate material and is volatilized. Therefore, results are improved when using a pixel dwell time only long enough to react the adsorbed reaction gas and material layer.

Figure 4:
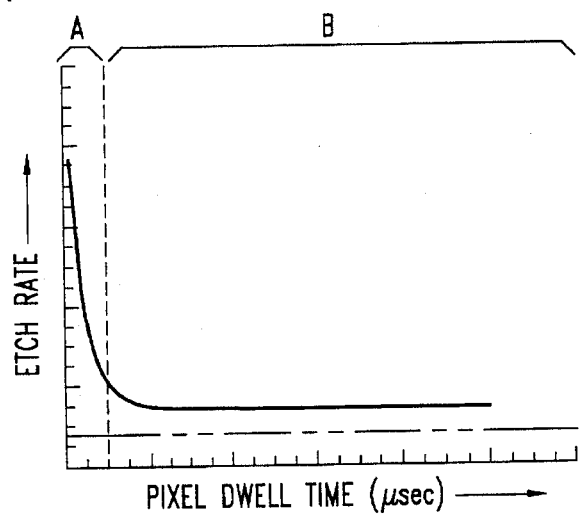
FIG. 4 is a plot of etch rate vs. pixel dwell time.

To determine the pixel dwell time in which the particle beam reacts the adsorbed gas with the material layer, the etch rate is plotted as a function of the pixel dwell time. An example of this plot is shown in FIG. 4. In FIG. 4 the region labelled "A" corresponds to the depletion of the adsorbed layer by the focused energy beam, while region "B" corresponds to the equilibrium etch rate. The equilibrium etch rate is a combination of physical and chemical material removal. The horizontal dashed line in FIG. 4 represents the material removal rate for physical sputtering alone. This graph demonstrates that short pixel dwell times should be used to operate the process in the region "A". For each material/gas system used, this plot can be generated to determine the optimal pixel dwell time, i.e., to determine the boundaries of region "A".

In addition to determining the pixel dwell time, the time it takes for the next layer of reaction gas to be adsorbed on the surface, i.e., the gas refresh time, is determined to ensure that the particle beam operates within region "A" of FIG. 4. The gas refresh time is a function of the background pressure, the local gas pressure, the layer adsorbing the gas, and the composition of the gas. The refresh time may readily be determined by scanning a recently etched region with the particle beam at different intervals and measuring the etch rate. When a layer of reaction gas is adsorbed, the etch rate will be greatest.

For focused ion beam-assisted etching of tungsten with $XeF_2$ using 0.03–3.3 Torr local pressure and approximately $1 \times 10^{-7}$ background pressure, refresh times are in the range of approximately 10–30 milliseconds. Because pixel dwell times for this system are in the range of 1–10 microseconds, removal of very small defects requires a pause between scans to ensure sufficient refresh time.

Once the pixel dwell time and refresh time are determined, the particle beam is scanned accordingly for improved etching results. Because the region being impinged by particle beam 142 is simultaneously imaged, the endpoint of etching layer 20 can easily be determined. Upon removal of layer 20, layer 15 will not be appreciably etched by particle beam 142. At this point in the process, valve 134 is optionally closed to stop the flow of reaction gas through capillary 138. Removal of layer 15 may then proceed by impinging particle beam on layer 15 to remove the material through a physical sputtering process. Alternatively, the same reaction gas may be input, with greatly reduced chemical enhancement of the etching process, or a reaction gas which creates volatile reaction products with layer 15 following activation may be input through capillary 138.

EXAMPLE:

Tungsten/chromium multilayer structures were deposited on 3 inch diameter (100) silicon wafer using a CVC 601 rf diode sputtering system with a load lock. In this system, a tungsten target of 20 cm. diameter and a chromium target of 20 cm. diameter are positioned about 8 cm. away from the silicon membrane. The system base pressure was $1\times10^{-7}$ Torr. Pure argon was backfilled into the system for use as the sputtering gas. Multilayer chromium (200 Å)/tungsten (3000 Å)/chromium (300 Å) structures corresponding to layers 15, 20, and 30, respectively, were deposited by positioning the substrate holder alternately over the tungsten target and the chromium target without breaking vacuum between successive layers.

A focused ion beam system with a 20 keV $Ga^+$ liquid metal ion source was used as the focused particle beam for the chemical reaction. A 10 micron² window was selected to be etched in the multilayer Cr/W/Cr structure.

A capillary tube having an outer diameter of 200 microns and an inner diameter of 100 microns was positioned approximately 50 microns above the sample in the field of view of the focused ion beam. $XeF_2$ was flowed through the capillary tube to create a local pressure on the order of 1 Torr in the region of the multilayer structure to be etched.

Using an ion dose of $4.5\times10^{17}$ cm$^{-2}$ and a pixel dwell time of 5 microseconds, the top chromium layer was etched. Because any formed fluorides of chromium were not volatile, the etching of chromium proceeded via a predominantly physical mechanism.

Following removal of the top chromium layer, the tungsten layer was etched using the $XeF_2$ activated by the focused ion beam. During tungsten etching, it is postulated that the reaction proceeds as:

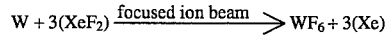

$$W + 3(XeF_2) \xrightarrow{\text{focused ion beam}} WF_6 + 3(Xe)$$

Figure 1:
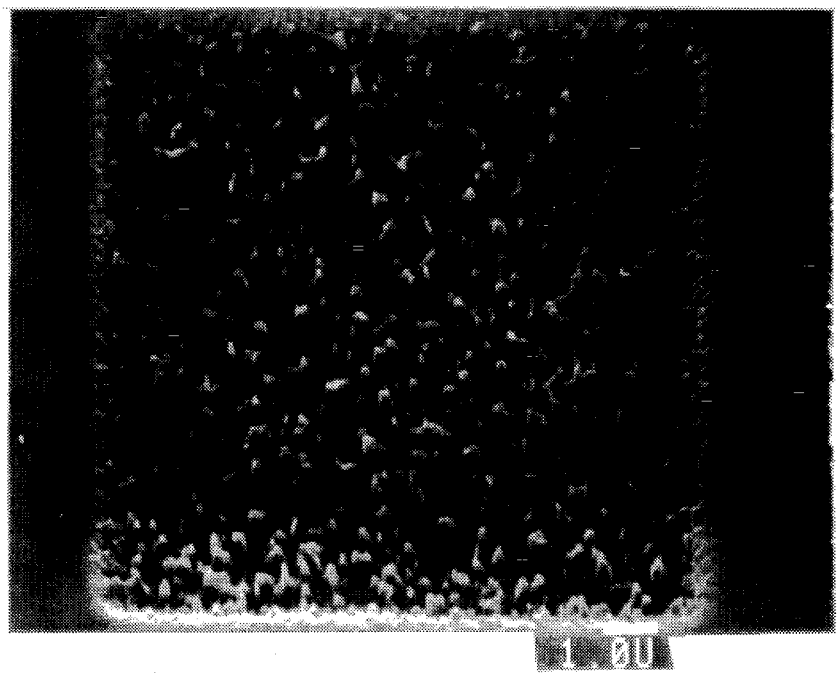
FIG. 1 is a photomicrograph of a multilayer film etched by a prior art ion beam process.
Figure 5:
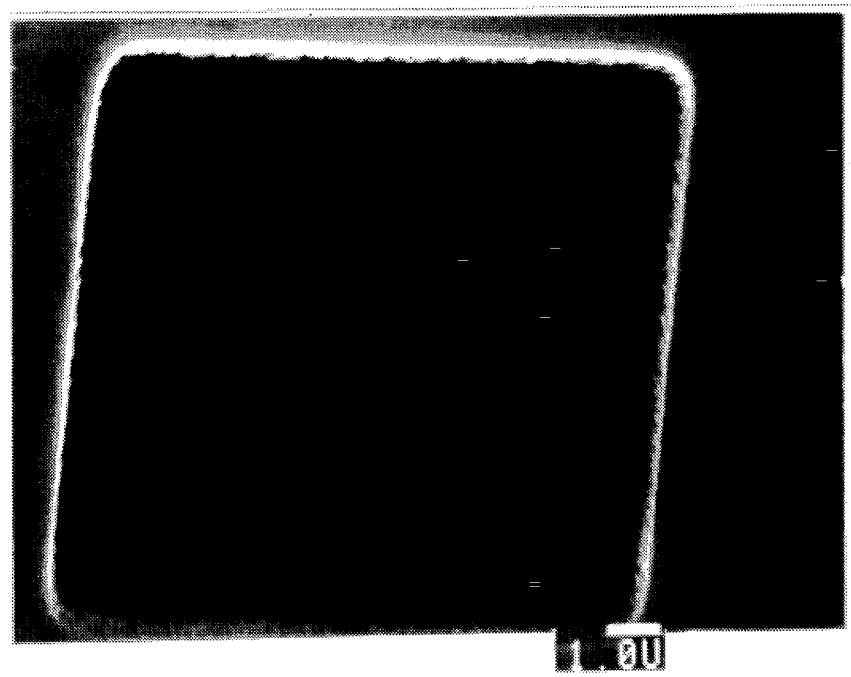
FIG. 5 is a photomicrograph of a multilayer film etched according to the process of the present invention.

The results of the tungsten etch by $XeF_2$ are shown in FIG. 5. As seen from the figure, the tungsten has been completely removed, eliminating the roughness resulting from physical sputtering, as in FIG. 1.

The bottom layer of chromium was etched following tungsten removal. As with the top layer of chromium, the etching proceeded via a predominantly physical mechanism.

While the invention has been particularly shown and described with respect to the preceding embodiments, other embodiments are clearly within the scope of the invention. For example, the process of the present invention finds application in the removal of defects or altering mask patterns for various types of masks including, but not limited to, optical and SCALPEL masks. The process also applies to etching of electronic devices and other multilayer structures. Many materials are removed according to the process of the present invention. Layer 20 can be selected from other refractory metals such as tantalum, or alloys of refractory metals with each other and/or other materials. Layers 15 and 30 can be other metals such as aluminum or titanium.

We claim:

1. A process for locally etching at least a portion of a material disposed on a substrate comprising:

providing a first material on a substrate having a first etch rate by an activated reaction gas;

providing a second material disposed over at least a portion of said first material, said second material having a second etch rate by said reaction gas, said second etch rate being substantially greater than said first etch rate;

flowing a reaction gas adjacent a portion to be removed of said second material, said reaction gas being chemically reactive with at least said second material to form volatile reaction products when activated by a focused particle beam; and irradiating said portion with a focused particle beam to initiate a chemical reaction between said portion and said reaction gas, removing said portion of the second material.

2. A process :for locally etching at least a portion of a material as recited in claim 1 wherein said first material is chromium.

3. A process for locally etching at least a portion of a material as recited in claim 1 wherein said second material is tungsten.

4. A process for locally etching at least a portion of a material as recited in claim 1 wherein said reaction gas comprises a gas selected from $XeF_2$, $CF_4$, $NF_3$, $CCl_3F$, $CCl_2F_2$, $CClF_3$, $C_2F_6$, $C_3F_8$, $SF_6$, and $WF_6$.

5. A process for locally etching at least a portion of a material as recited in claim 1 wherein said focused particle beam is selected from electron beams and ion beams.

6. A process for removing an opaque defect from a lithography mask comprising:

providing a mask having at least first and second vertically adjacent metal layers defining a pattern on a substrate, said second metal layer having a higher etch rate by a reaction gas than said first metal layer;

defining a region of an opaque defect of said first and second metal layers;

flowing a reaction gas adjacent said opaque defect, said reaction gas being chemically reactive with at least said second material to form volatile reaction products when activated by a particle beam; and irradiating said opaque defect with a focused particle beam to initiate a chemical reaction between at least said second layer of said opaque defect and said reaction gas to form volatile reaction products; and removing said volatile reaction products.

7. A process for removing an opaque defect from a lithography mask as recited in claim 6 wherein said first metal layer is chromium.

8. A process for removing an opaque defect from a lithography mask as recited in claim 6 wherein said second metal layer is tungsten.

9. A process for removing an opaque defect from a lithography mask as recited in claim 6 wherein said reaction gas in selected from $XeF_2$, $CF_4$, $NF_3$, $CCl_3F$, $CCl_2F_2$, $CClF_3$, $C_2F_6$, $C_3F_8$, $SF_6$, and $WF_6$.

10. A process for removing an opaque defect from a lithography mask as recited in claim 6 wherein the focused particle beam is selected from electron beams and ion beams.

11. A process for removing a portion of a tungsten layer from an x-ray mask comprising:

providing an x-ray mask comprising a silicon, silicon nitride, silicon carbide, or diamond membrane having at least a layer of chromium and a layer of tungsten disposed thereon, said layer of chromium and said layer of tungsten defining a pattern for resist exposure;

locally flowing a reaction gas including a gas selected from $XeF_2$, $NF_3$, $CF_4$, $C_2F_6$, and $C_3F_8$ adjacent a portion of the tungsten layer to be removed;

irradiating said portion of the tungsten layer to be removed with a particle beam selected From focused ion beams and electron beams to initiate a chemical reaction between the reaction gas and the tungsten layer, said chemical reaction forming volatile reaction products; and removing said volatile reaction products.

12. The product formed by the process of claim 11.

13. A process for removing at least a portion of a tungsten layer from an x-ray mask as recited in claim 11 further comprising an additional layer of material disposed over said layer of tungsten.

14. A process for removing at least a portion of a tungsten layer from an x-ray mask as recited in claim 13 wherein said additional layer of material is chromium.

15. A process for removing at least a portion of a tungsten layer from an x-ray mask as recited in claim 14 wherein a remaining portion of the tungsten layer has a sidewall roughness of less than 0.02 microns.

* * * * *